United States Patent
Lee et al.

(10) Patent No.: US 8,354,744 B2
(45) Date of Patent: Jan. 15, 2013

(54) STACKED SEMICONDUCTOR PACKAGE HAVING REDUCED HEIGHT

(75) Inventors: Byung-Woo Lee, Suwon-si (KR); Young-Lyong Kim, Seongnam-si (KR); Eun-Chul Ahn, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 144 days.

(21) Appl. No.: 12/710,486

(22) Filed: Feb. 23, 2010

(65) Prior Publication Data

US 2010/0213593 A1    Aug. 26, 2010

(30) Foreign Application Priority Data

Feb. 23, 2009  (KR) ............... 10-2009-0014943

(51) Int. Cl.
    *H01L 23/02*    (2006.01)
(52) U.S. Cl. ........ 257/686; 257/777; 257/778; 257/781; 257/784; 438/108; 438/109; 438/118; 438/127
(58) Field of Classification Search ............ 257/777, 257/778, 723, 686, 737, 738, 787, 788, 792, 257/793, 779, 780, 781, 782, 783, 784, 786; 438/106, 108, 109, 127, 118
    See application file for complete search history.

(56) References Cited

U.S. PATENT DOCUMENTS

| | | | |
|---|---|---|---|
| 5,595,934 A * | 1/1997 | Kim | .......... 438/768 |
| 7,245,008 B2 * | 7/2007 | Lee | .......... 257/686 |
| 7,345,361 B2 | 3/2008 | Mallik et al. | |
| 7,768,125 B2 * | 8/2010 | Chow et al. | .......... 257/738 |
| 8,125,092 B2 * | 2/2012 | Corisis et al. | .......... 257/784 |
| 2004/0207065 A1 * | 10/2004 | Chang et al. | .......... 257/686 |
| 2007/0262445 A1 * | 11/2007 | Takyu et al. | .......... 257/723 |
| 2008/0074852 A1 * | 3/2008 | Lee | .......... 361/749 |
| 2008/0105962 A1 * | 5/2008 | Lee et al. | .......... 257/686 |
| 2011/0062574 A1 * | 3/2011 | Jang et al. | .......... 257/686 |

FOREIGN PATENT DOCUMENTS

| | | |
|---|---|---|
| JP | 2006-303079 | 11/2006 |
| KR | 2005-96351 | 10/2005 |
| KR | 2008-7893 | 1/2008 |

* cited by examiner

*Primary Examiner* — Ha Tran T Nguyen
*Assistant Examiner* — Thanh Y Tran
(74) *Attorney, Agent, or Firm* — Stanzione & Kim, LLP

(57) ABSTRACT

A stacked semiconductor package includes an upper unit package and a lower unit package. The lower unit package includes a substrate, a semiconductor chip disposed on an upper surface of the substrate, terminal pads arranged on an upper surface of the semiconductor chip, protrusions formed on the terminal pads, a protective layer formed on the substrate and covering the semiconductor chip and the protrusions, and openings formed in the protective layer and exposing the protrusions. The upper unit package includes a substrate, ball lands provided on a lower surface of the substrate, and solder balls formed on the ball lands. The solder balls of the upper unit package are inserted into the openings of the lower unit package to be connected to the protrusions of the lower unit package.

20 Claims, 9 Drawing Sheets

STACKED SEMICONDUCTOR PACKAGE HAVING REDUCED HEIGHT

CROSS-REFERENCE TO RELATED APPLICATIONS

This application claims the benefit of priority under 35 U.S.C. §119 from Korean Patent Application No. 10-2009-0014943, filed on Feb. 23, 2009, the contents of which are hereby incorporated herein by reference in its entirety.

BACKGROUND

1. Field of the Invention

Example embodiments relate to a stacked semiconductor package, and more specifically, to the shape of a unit package to electrically connect an upper unit package to a lower unit package.

2. Description of the Related Art

Recently, as the miniaturization of semiconductor products accelerates, the miniaturization of semiconductor packages as well as high integration of semiconductor chips is becoming necessary. For the miniaturization of the semiconductor packages, a stacked semiconductor package in which a plurality of packages is stacked has been developed.

As a specific example of the stacked semiconductor package, there is provided a stacked semiconductor package having a ball grid array (BGA) package positioned at the lower part thereof and another BGA package stacked on the BGA package.

In such a package, solder balls of the upper BGA package are mounted on the lower BGA package so as to be electrically connected.

However, for the electrical connection between the upper BGA package and the lower BGA package, separate bump regions or solder ball regions, on which the solder balls of the upper BGA package are to be mounted, need to be formed on the lower BGA package.

SUMMARY

Example embodiments of the present general inventive concept provide a semiconductor package which can implement high integration and miniaturization of semiconductor packages.

Example embodiments also provide a semiconductor package in which separate bump regions or solder ball regions need not be formed.

Additional aspects and utilities of the present general inventive concept will be set forth in part in the description which follows and, in part, will be obvious from the description, or may be learned by practice of the general inventive concept.

Features and/or utilities of the present general inventive concept may be realized by a stacked semiconductor package including an upper unit package and a lower unit package. The lower unit package may include a substrate, a semiconductor chip disposed on an upper surface of the substrate, terminal pads arranged on an upper surface of the semiconductor chip, protrusions formed on the terminal pads, a protective layer formed on the substrate and covering the semiconductor chip and the protrusions, and openings formed in the protective layer and exposing the protrusions. The upper unit package may include a substrate, ball lands provided on a lower surface of the substrate, and solder balls formed on the ball lands. The solder balls of the upper unit package may be inserted into the openings of the lower unit package to be connected to the protrusions of the lower unit package.

The openings formed in the protective layer of the lower unit package may be formed at regions corresponding to the protrusions of the lower unit package.

The openings formed in the protective layer of the lower unit package may be line-shaped grooves.

The terminal pads of the lower unit package may be arranged in a line.

The terminal pads of the lower unit package may be arranged in a line through redistribution.

The lower unit package may further include conductive wires to electrically connect the substrate of the lower unit package to the semiconductor chip of the lower unit package.

The lower unit package may further include wire bonding pads in the vicinities of both edges of the upper surface of the substrate of the lower unit package, and the conductive wires may electrically connect the terminal pads provided on the semiconductor chip of the lower unit package to the wire bonding pads.

The lower unit package may further include wire bonding pads in the vicinities of both edges of the upper surface of the substrate of the lower unit package, and the conductive wires may electrically connect the protrusions formed on the terminal pads of the semiconductor chip of the lower unit package to the wire bonding pads.

The lower unit package may further include ball lands provided on the lower surface of the substrate of the lower unit package, and solder balls formed on the ball lands of the lower unit package.

The upper unit package may further include a semiconductor chip disposed on the upper surface of the substrate of the upper unit package, terminal pads arranged on the upper surface of the semiconductor chip of the upper unit package, protrusions formed on the terminal pads of the upper unit package, a protective layer formed on the substrate of the upper unit package and covering the semiconductor chip and the protrusions of the upper unit package, and openings formed in the protective layer of the upper unit package and exposing the protrusions of the upper unit package.

Features and/or utilities of the present general inventive concept may also be realized by a stackable semiconductor package including a substrate having lands on a bottom surface and bonding pads on an upper surface, a semiconductor chip mounted to the upper surface of the substrate and including at least one terminal pad on an upper surface of the semiconductor chip, a conductive protrusion on the terminal pad, and a protective layer covering the semiconductor chip and the conductive protrusion and including an opening to expose an upper surface of the conductive protrusion.

The stackable semiconductor package may further include a wire to connect the terminal pad of the semiconductor chip with a bonding pad of the substrate.

The wire may be directly connected to the terminal pad and the conductive protrusion may be formed to enclose a portion of the wire. Alternatively, the wire may be directly connected to the conductive protrusion and not to the terminal pad.

A height of the wire above the upper surface of the semiconductor chip may be less than a height of the conductive protrusion.

The at least one conductive protrusion may include at least one of gold, silver, copper, nickel, aluminum, tin, lead, platinum, bismuth, indium, an alloy thereof, or a combination thereof.

The conductive protrusion may include a plurality of conductive protrusions arranged in a row, and the opening in the protective layer may include a linear groove in the protective layer extending between and including regions corresponding to the plurality of conductive protrusions.

A height of the conductive protrusion above the semiconductor chip may be the same as a height of the protective layer above the semiconductor chip.

A height of the conductive protrusion above the semiconductor chip may be greater than a height of the protective layer above the semiconductor chip.

Features and/or utilities of the present general inventive concept may also be realized by a stacked semiconductor package including a first semiconductor package, a second semiconductor package, and a solder connection to connect the first semiconductor package to the second semiconductor package. The first semiconductor package may include a first substrate having at least one land on a bottom surface and at least one bonding pad on an upper surface, a first semiconductor chip mounted to the upper surface of the first substrate and including at least one terminal pad on an upper surface of the first semiconductor chip, at least one first conductive protrusion on the at least one terminal pad, and a first protective layer covering the first semiconductor chip and the first conductive protrusion and including an opening to expose an upper surface of the first conductive protrusion. The second semiconductor package may include a second substrate having at least one land on a bottom surface and at least one bonding pads on an upper surface, a second semiconductor chip mounted to the upper surface of the second substrate, and a second protective layer to cover the second semiconductor chip. The solder connection may connect the at least one land on the bottom surface of the second substrate with the at least one first conductive protrusion.

At least one of the first semiconductor package and the second semiconductor package may include a wire to connect the terminal pad of the first or second semiconductor chip with the bonding pad of the first or second substrate, respectively.

The wire may be directly connected to the terminal pad and the respective conductive protrusion is formed to enclose a portion of the wire.

The wire may be directly connected to the first conductive protrusion and not to the terminal pad of the first semiconductor chip.

The wire may connect the terminal pad of the first semiconductor chip with the bonding pad of the first substrate, and a height of the wire above the upper surface of the first semiconductor chip may be less than a height of the first conductive protrusion.

The second semiconductor package may not include a conductive protrusion on an upper surface of the second semiconductor chip.

The second semiconductor package may not include an opening in the second protective layer above the second semiconductor chip.

The at least one first conductive protrusion may include a plurality of conductive protrusions arranged in a row, and the opening in the first protective layer may include a linear groove in the first protective layer extending between and including regions corresponding to the plurality of conductive protrusions.

Features and/or utilities of the present general inventive concept may also be realized by a method of manufacturing a stackable semiconductor package, the method including mounting a semiconductor chip on an upper surface of a substrate, forming at least one conductive protrusion on at least one terminal pad on an upper surface of the semiconductor chip, and forming a protective layer to cover the semiconductor chip and the at least one conductive protrusion, the protective layer having at least one opening to expose an upper surface of the at least one conductive protrusion.

The method may further include forming at least one wire to connect the at least one terminal pad to a respective bonding pad on an upper surface of the substrate.

The at least one conductive protrusion may be formed after forming the at least one wire, and the at least one conductive protrusion may be formed to enclose a portion of the wire that is connected to the at least one terminal pad.

The at least one conductive protrusion may be formed on the at least one terminal pad of the semiconductor chip before the semiconductor chip is mounted on the upper surface of the substrate, and the at least one wire may be directly connected to the at least one conductive protrusion and may not be directly connected to the at least one terminal pad.

Forming the protective layer may include forming the protective layer to entirely cover the conductive protrusion and removing a portion of the protective layer corresponding to a portion of the upper surface of the conductive protrusion.

The portion of the protective layer may be removed using a laser.

The conductive protrusion may include a plurality of conductive protrusions and only a portion of the conductive layer corresponding to portions of the upper surfaces of each conductive protrusion may be removed.

The conductive protrusion may include a plurality of conductive protrusions arranged in a row, and removing the portion of the protective layer may include forming a linear groove in the protective layer between and including regions corresponding to upper surfaces of the conductive protrusions arranged in a row.

The linear groove may be formed by using a sorter.

Features and/or utilities of the present general inventive concept may also be realized by a method of forming a stacked semiconductor package, the method including mounting a first semiconductor chip on an upper surface of a first substrate, forming at least one conductive protrusion on at least one terminal pad on an upper surface of the first semiconductor chip, forming a first protective layer to cover the first semiconductor chip and the at least one conductive protrusion, the first protective layer having at least one opening to expose an upper surface of the at least one conductive protrusion, mounting a second semiconductor chip on an upper surface of a second substrate, and electrically connecting the at least one conductive protrusion with a conductive land on a bottom surface of the second substrate.

Electrically connecting the at least one conductive protrusion with the conductive land may include forming a solder ball on the conductive land and electrically connecting the solder ball to the conductive protrusion.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
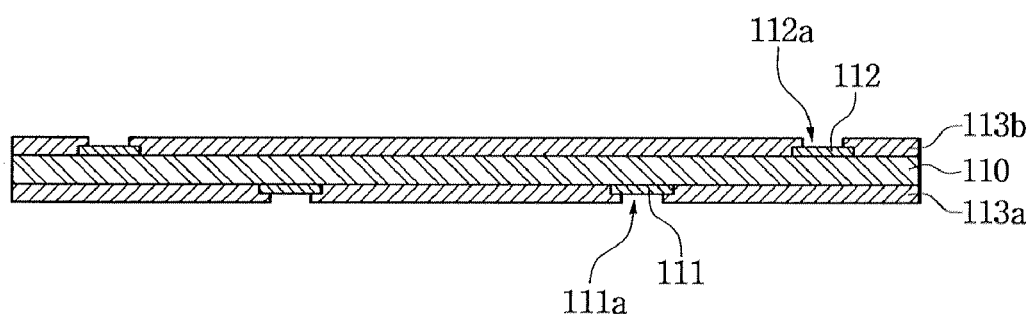
FIG. 1 illustrates a substrate of a semiconductor package according to the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Detailed illustrative embodiments are disclosed herein. However, specific structural and functional details disclosed herein are merely representative for purposes of describing example embodiments. This general inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present general inventive concept is not limited to example embodiments described.

Example embodiments relate to a stacked semiconductor package.

FIGS. 1 to 5 are diagrams showing methods of manufacturing a stacked semiconductor package according to example embodiments.

Figure 4:
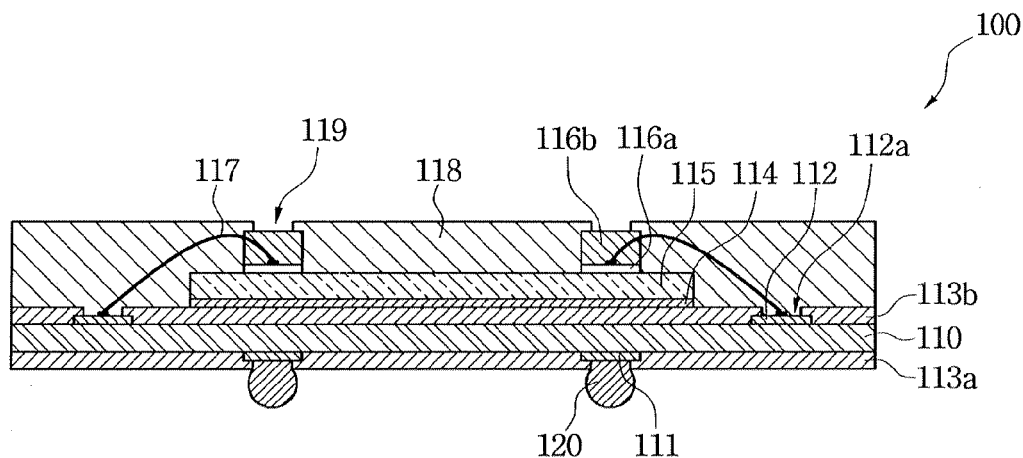
FIG. 4 illustrates an example of a unit package according to an embodiment of the present general inventive concept.

Referring to FIGS. 1 and 4, in a semiconductor unit package 100 according to example embodiments, a substrate 110 is provided. The substrate 110 may be a printed circuit board (PCB), a tape, a lead frame, or a wafer. The substrate 110 may be a PCB having wire bonding pads 112 provided in the vicinities of both edges of an upper surface thereof and ball lands 111 provided on a bottom surface thereof.

The wire bonding pads 112 correspond to electrode pads of input/output (I/O) electrodes to electrically connect to external devices, and any one of the wire bonding pads may be a dummy pad. A dummy pad may be designed either to pass a signal through or around a chip without interacting with circuitry in the chip or to not pass any signal. For example, a pad may be used for structural purposes.

For example, a stacked semiconductor package of FIG. 5, which will be described below, may be constructed by stacking a unit package P1 on top of a unit package P2. If the upper P1 and lower P2 unit packages are designed to share I/O signals, the above-described wire bonding pads 112 correspond to electrode pads of I/O electrodes to connect the semiconductor chip 115 to external devices. When the semiconductor package is designed so that the upper and lower unit packages P1 and P2 do not share a signal, any one of the wire bonding pads 112 may be a dummy pad which does not deliver the signal to the corresponding semiconductor chip 115.

If the stacked semiconductor package is designed to transmit a signal from a ball land 111 of the lower unit package P2 only to the upper-most semiconductor unit package P3, the wire bonding pads 112 or at least one of the terminal pads 116a of the first and second unit packages P1 and P2 may be dummy pads that are not connected to electrodes of the respective semiconductor chips 115. Consequently, a signal may enter a solder land 111 of the second unit package P2 and travel along a circuit path including the bonding wire 117 and protrusion 116b of the lower and intermediate semiconductor packages P2 and P1 without transmitting the signal to either of the lower and intermediate semiconductor packages P2 and P1. Since the use of dummy pads is known to those of ordinary skill in the art of stacked semiconductor packages, a detailed description of the operation of dummy pads is omitted.

The substrate 110 includes solder resist layers 113a and 113b disposed on the wire bonding pads 112 and the ball lands 111, respectively. The solder resist layers 113a and 113b have openings 111a and 112a such that the wire bonding pads 112 and the ball lands 111 are partially exposed through the openings.

The ball lands 111 may have the same size as terminal pads which will be described below, and may be formed at positions corresponding to the terminal pads.

Figure 2A:
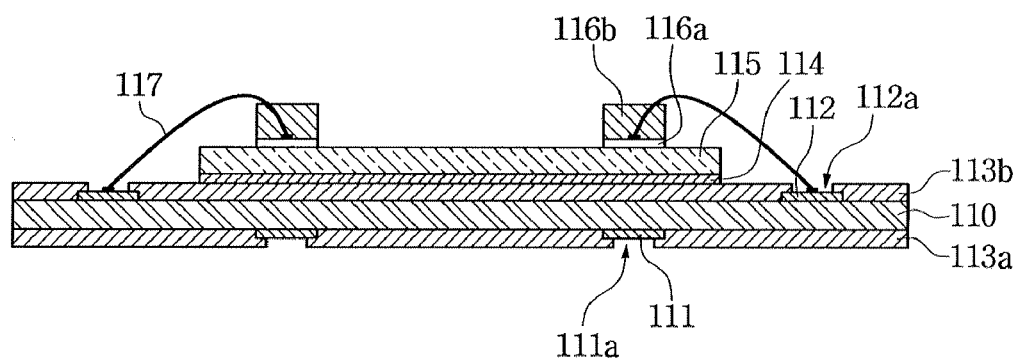
FIGS. 2A and 2B illustrate alternative embodiments of a protrusion formed on terminals of a semiconductor chip on the substrate according to the present general inventive concept.

Referring to FIG. 2A, a semiconductor chip 115 is attached to the upper surface of the substrate 110 through an insulating adhesive 114. The semiconductor chip 115 includes a circuit unit (not shown) which may store and process information and terminal pads 116a which are electrically connected to the circuit unit and may be arranged in a line on the upper surface of the semiconductor chip 115. The terminal pads 116a are electrically connected to the wire bonding pads 112 through conductive wires 117.

Bumps or solder balls may be formed on the terminal pads 116a to form protrusions 116b.

Figure 3A:
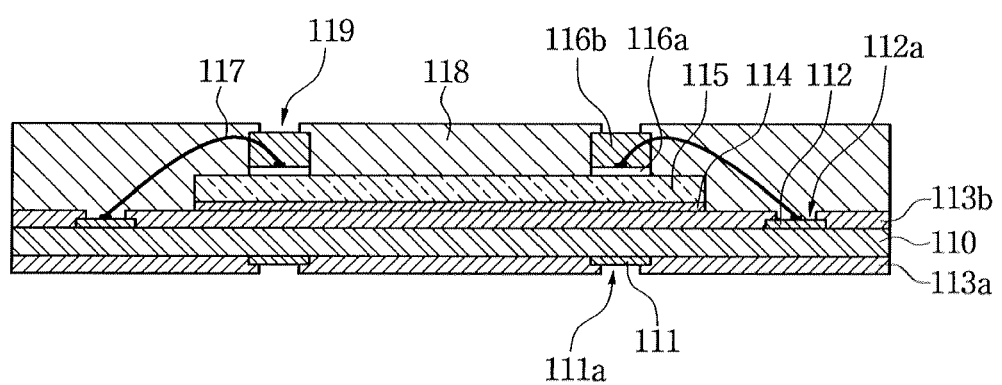
FIG. 3A illustrates a protective layer formed on the substrate, semiconductor chip, and protrusion according to the present general inventive concept.
Figure 3B:
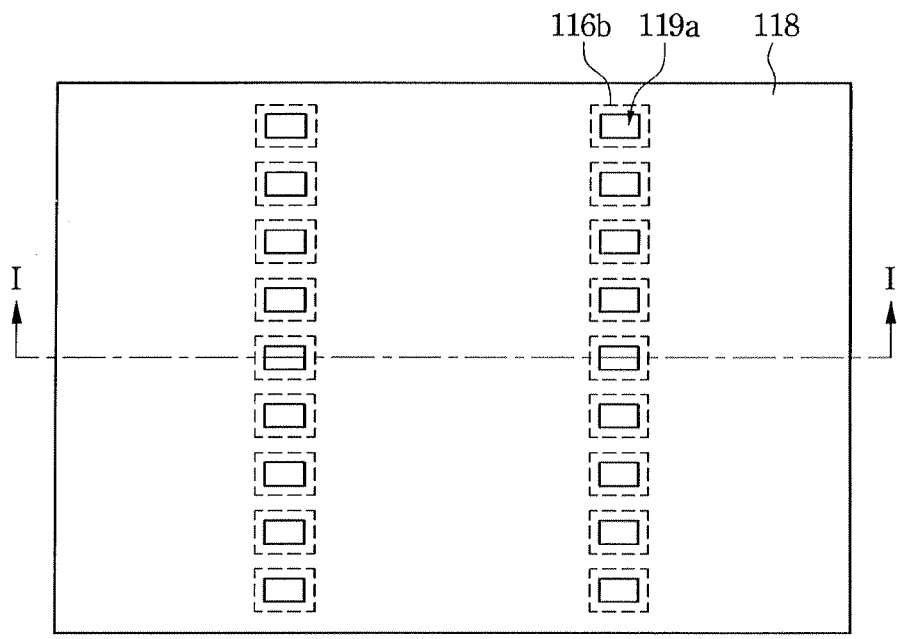
FIGS. 3B and 3C illustrate alternative embodiments of forming openings above the protrusions according to the present general inventive concept.

Since the protrusions 116b are formed on the terminal pads 116a arranged in a line, respectively, the protrusions 116b are arranged in a line on the upper surface of the semiconductor chip 115, as shown in FIG. 3B which will be described below.

The bumps may be formed of an alloy of gold, silver, copper, nickel, aluminum, tin, lead, platinum, bismuth, indium, an alloy thereof or a combination thereof. Forming the bumps may be performed by electroless plating/electroplating, deposition, sputtering, or screen printing. Further, the solder balls may be formed by heat-treating after arranging the solder balls on the terminal pads 116a.

Figure 2B:
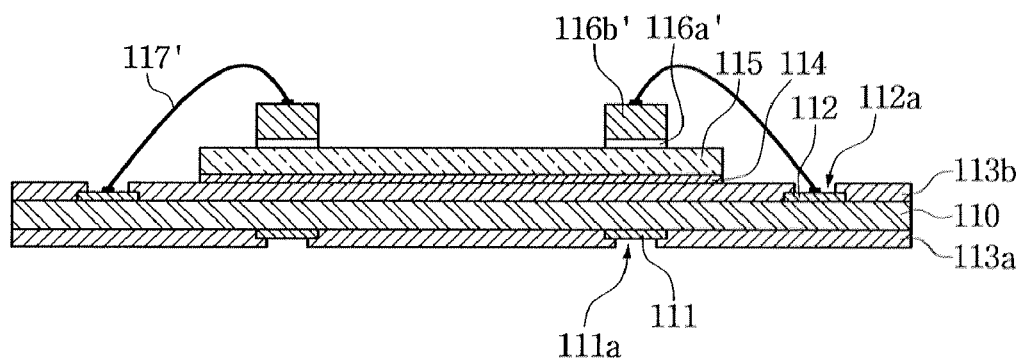

In FIG. 2A, the terminal pads 116a and the wire bonding pads 112 are electrically connected through the conductive wires 117, and the protrusions 116b are then formed on the terminal pads 116a. Referring to FIG. 2B, however, protrusions 116b' are formed on terminal pads 116a', and then are electrically connected to the wire bonding pads 112 through conductive wires 117'.

In other words, in FIG. 2A, one end of a conductive wire 117 is connected to a wire bonding pad 112 of the substrate and the other is connected to a terminal pad 116a of the semiconductor chip 115. On the other hand, in FIG. 2B, one end of the conductive wire 117' is connected to the bonding pad and the other is connected to the conductive protrusion 116b' formed on the terminal pad 116a' of the semiconductor chip 115.

In FIGS. 1 and 2A, the protrusions 116b are formed after the semiconductor chip 115 is attached to the substrate 110. However, the protrusions 116b may be formed on the semiconductor chip 115 before the semiconductor chip 115 is mounted to the substrate 110. In such a case, conductive wires 117' may be formed to the protrusions 116b' instead of the terminal pad 116a'

As the conductive wires, gold wires or aluminum wires may be used.

Referring to FIG. 3A, a protective layer 118 covering the semiconductor chip 115, the conductive wires 117, and the protrusions 116b is formed on the substrate 110.

That is, when the semiconductor chip 115 and the substrate 110 are electrically connected through the conductive wires 117, the protective layer 118 covering the semiconductor chip 115, the conductive wires 117, and the protrusions 116b is formed on the substrate 110 to protect the upper parts of the semiconductor chip 115 and the substrate 110 and the conductive wires 117 from the external environment. The protective layer 118 may be formed of an epoxy molding compound, for example. Openings 119 may be formed in the protective layer 118 to expose the protrusions 116b through the openings 119.

Figure 3C:
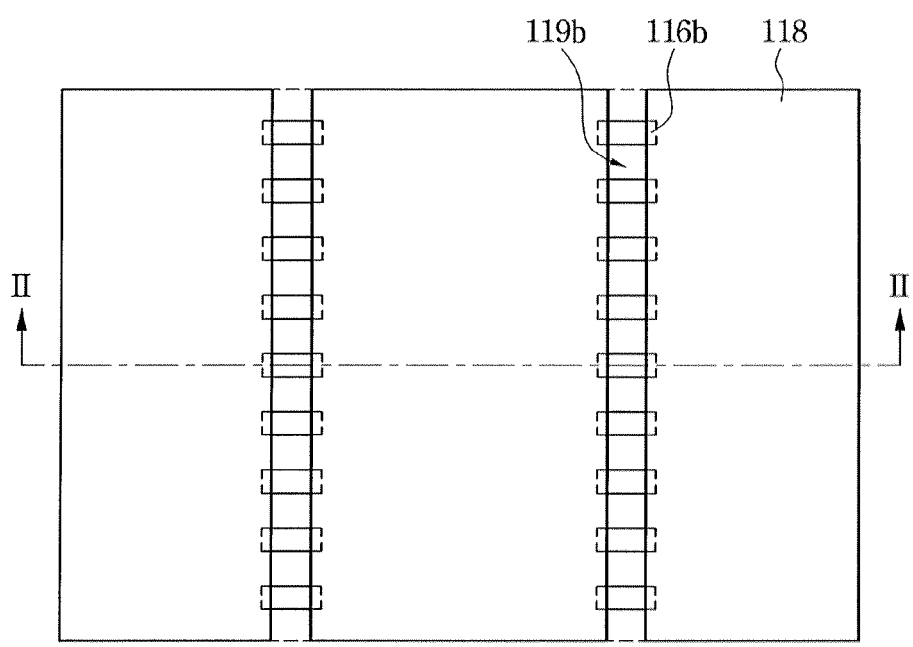

FIG. 3B is a plan view showing a first shape of openings according to example embodiments, and FIG. 3C is a plan view showing a second shape of openings according to example embodiments.

FIG. 3A is a cross-sectional view taken along line I-I of FIG. 3B or line II-II of FIG. 3C.

Referring to FIG. 3B, the openings 119a within the protective layer 118 may be formed by a laser. That is, after the protective layer 118 is formed, the openings 119a may be formed by laser drilling such that the protrusions 116b are exposed.

Referring to FIG. 3C, openings 119b within the protective layer 118 may be formed by a sorter. As the sorter, a sawing device disclosed in Korean Patent Laid-open Publication No. 2005-0096351 or the like may be applied, for example.

In FIG. 3C, after the protective layer 118 is formed, the sorter may be used to form the openings 119b across the surface of the protective layer 118 along the protrusions 116b arranged in a line such that the protrusions 116b are exposed. In addition, the protective layer 118 located between the protrusions 116b is also exposed along the groove formed by the sorter. The opening 119b illustrated in FIG. 3C is defined as a line-shaped groove.

Forming the line-shaped groove 119b along the protrusions 116b arranged in a line using a sorter may increase production per unit time, compared to forming the openings using a laser.

That is, when the openings are formed by a laser, the openings 119a can be formed only at the regions corresponding to the protrusions 116b, which requires multiple processes of moving the substrate or multiple lasers to expose a plurality of protrusions 116b. Therefore, production per unit time is low. However, when the opening 119b is formed by a sorter, the opening is formed across the regions which do not correspond to the protrusions 116b as well as the regions corresponding to the protrusions 116b through one process. Therefore, it is possible to increase production per unit time by as much as about twenty times.

Figure 3D:
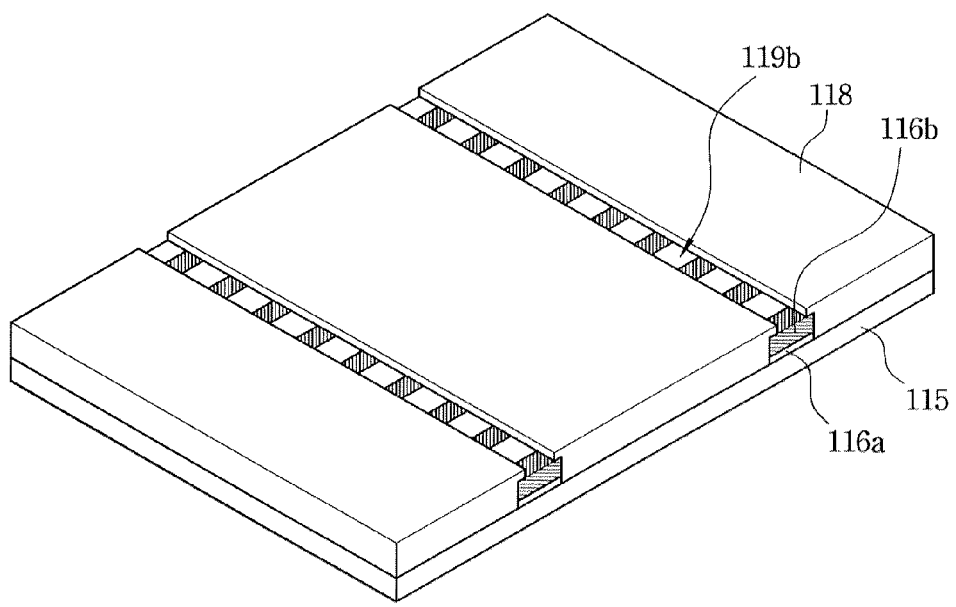
FIG. 3D illustrates a cut-away cross-section view of a portion of the semiconductor package according to an embodiment of the present general inventive concept.

FIG. 3D illustrates a cross-sectional perspective view of a portion of the semiconductor package of FIG. 3A. As illustrated in FIG. 3D, the sorter removes material in a line 119b to expose portions of the protrusions 116b located along the line as well as the protective layer 118 between the protrusions 116b located along the line.

Figure 3E:
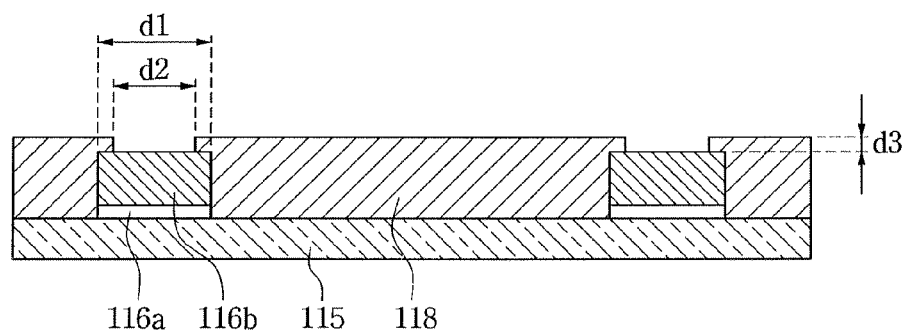
FIGS. 3E, 3F, and 3G illustrate cross-sectional side views of protrusions according to embodiments of the present general inventive concept.

FIG. 3E illustrates a side view of a portion of the semiconductor package of FIG. 3A. As illustrated in FIG. 3E, the protective layer 118 may be formed to cover portions of the top surfaces of the protrusions 116b. The protective layer 118 may leave a portion of the protrusion exposed to electrically connect with an external device. The protrusion 116b may have a length or a diameter d1, and the protective layer may have a length or diameter d2 that is less than d1, so that end portions of the upper surface of the protrusions 116b are covered by the protection layer 118. The protection layer 118 may also cover the upper surface of the protrusion 116b to have a depth d3. In other words, the upper surface of the protrusion 116b may be recessed below the upper surface of the protrusion layer by a distance d3.

Figure 3F:
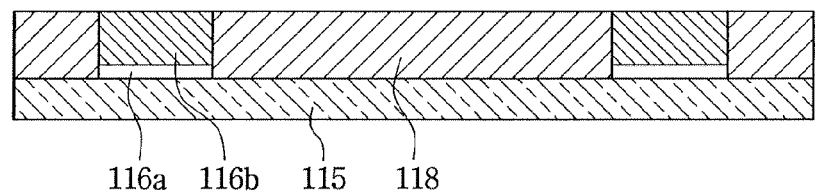
Figure 3G:
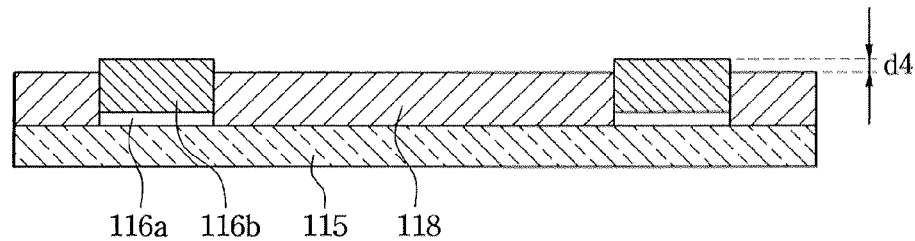

However, as illustrated in FIG. 3F, the protection layer 118 may be formed to have an upper surface that is substantially co-planar with the upper surface of the protrusion 116b. Alternatively, as illustrated in FIG. 3G, the protection layer 118 may be formed to have an upper surface that is recessed from the upper surface of the protrusion layer 116b by a distance d4.

Referring to FIG. 4, solder balls 120 may be formed on the ball lands 111 exposed through the openings 111a of the solder resist layer 113a, and then heat-treated to be electrically connected to the ball lands 111 to complete the unit package 100.

Figure 5:
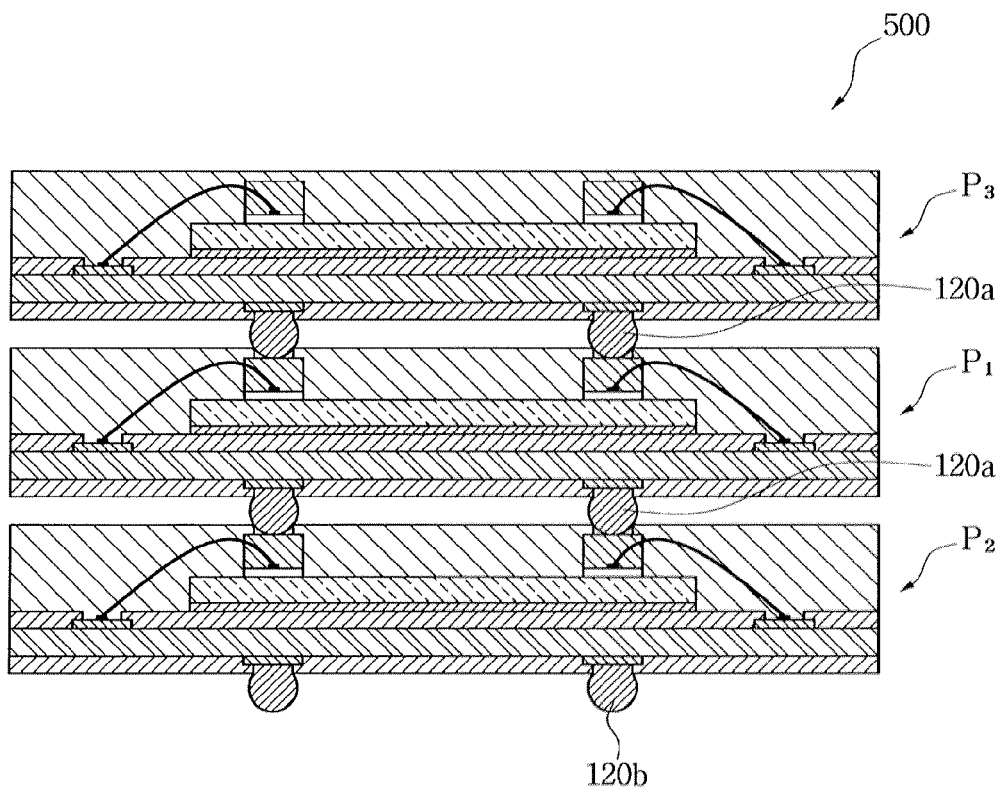
FIG. 5 illustrates an example of a stacked semiconductor package according to the present general inventive concept.

Referring to FIG. 5, a plurality of unit packages 100 of FIG. 4 may be stacked to form a stacked semiconductor package 500.

For example, a unit package P1 may be stacked on a unit package P2. The solder balls 120a disposed on the lower surface of the upper unit package P1 are inserted into the openings 119 of the lower unit package P2 to be connected to the protrusions 116b of the lower unit package to electrically connect the upper unit package P1 to the lower unit package P2.

The solder balls provided on the bottom of the lower unit package P2 may connect the stacked semiconductor package 500 to an external device.

In addition, a unit package P3 may be stacked on the upper unit package P2. The upper-most unit package P3 may be formed to have no openings 119 in the protective layer 118 to expose the protrusions 116b. Further, although not shown, the uppermost unit package P3 may be formed without protrusions 116b on the terminal pads 116a.

Figure 6A:
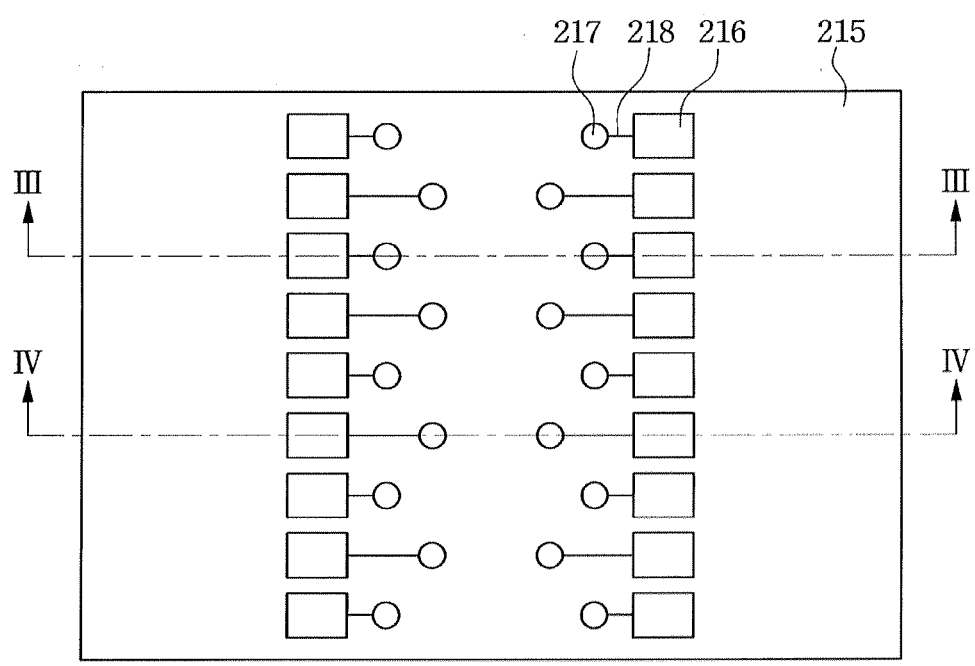
FIG. 6A is a plan view illustrating terminal pads formed on a semiconductor chip according to an embodiment of the present general inventive concept.

FIG. 6A is a plan view showing terminal pads formed on the semiconductor chip 115 according to an example embodiment of the present general inventive concept.

As described above, the terminal pads 116a may be arranged in a line on the upper surface of the semiconductor chip 115. As shown in FIGS. 3C and 3D, a sorter may be used to form an opening 119 in a line to expose multiple protrusions 116b at the same time through one process.

As shown in FIG. 6A, however, when first terminal pads 217 are not arranged in a line on the semiconductor chip 215, the first terminal pads 217 may be connected to redistribution patterns 218 to form second terminal pads 216 arranged in a line.

Figure 6B:
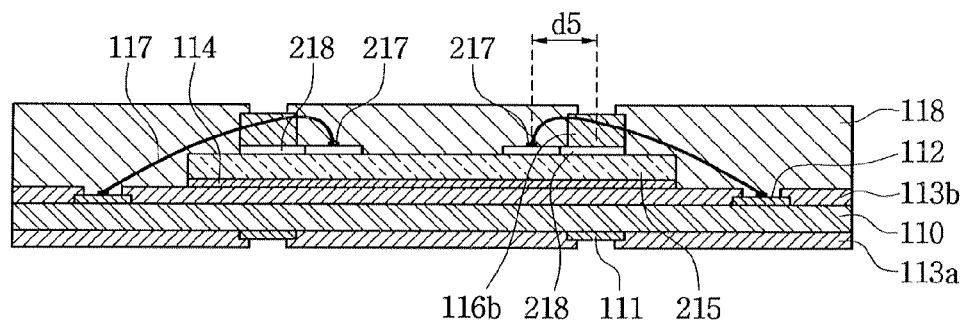
FIGS. 6B and 6C illustrate cross-section views of the semiconductor package of FIG. 6A.
Figure 6C:
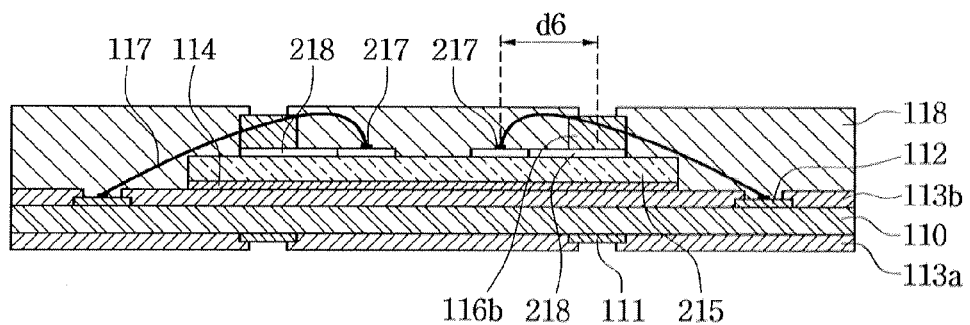

FIGS. 6B and 6C illustrate cross-sections of the semiconductor package of FIG. 6A taken along lines III and IV, respectively. As illustrated in FIG. 6B, a center of a terminal pad 217 is separated from a center of an opening 219 by a distance d5. Similarly, in FIG. 6C, a center of a terminal pad 217 is separated from a center of an opening 219 by a distance d6 that is different from the distance d5. Consequently, a redistribution pattern 218 may be formed on the semiconductor chip 215 to connect to the terminal pads 217 of FIGS. 6B and 6C, respectively, to form or connect to second terminal pads 216 arranged in a row to correspond to the openings 219. While the redistribution patterns 218 of FIGS. 6B and 6C make up the second terminal pads 216, the second terminal pads may also be separately formed on the semiconductor chip 215 and electrically connected to the first terminal pads 217, as illustrated in FIG. 6A.

As described above, a stacked semiconductor package may be manufactured by forming protrusions composed of bumps or solder balls are formed on electrode pads of a semiconductor chip. Consequently, separate bump regions or solder ball regions need not be formed on a unit package positioned at the bottom of a stacked semiconductor package to electrically connect a unit package positioned at the top of the stacked semiconductor package with the unit package positioned at the bottom of the stacked semiconductor package. Accordingly, it is possible to accomplish high integration and miniaturization of semiconductor packages.

Further, to expose the protrusions for electrically connecting unit packages after forming the protective layer, a sorter may be used to form an opening across the surface of the protective layer along the protrusions arranged in a line. Therefore, it is possible to increase production per unit time.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this general inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A stackable semiconductor package, comprising:
   a substrate having lands on a bottom surface and bonding pads on an upper surface;
   a semiconductor chip mounted directly to the upper surface of the substrate and including at least one terminal pad on an upper surface of the semiconductor chip;
   a conductive protrusion mounted directly on the terminal pad; and a protective layer to cover the semiconductor chip and an upper surface of the conductive protrusion and including an opening to expose an upper surface of the conductive protrusion.

2. The stackable semiconductor package according to claim 1, further comprising:
a wire to directly connect the terminal pad of the semiconductor chip with a bonding pad of the substrate.

3. The stackable semiconductor package according to claim 2, wherein the wire includes a connecting end that is directly connected to the terminal pad and the conductive protrusion is formed to enclose the connecting end and a portion of the wire.

4. The stackable semiconductor package according to claim 2, wherein the wire is directly connected to the conductive protrusion and not to the terminal pad.

5. The stackable semiconductor package according to claim 2, wherein a height of the wire above the upper surface of the semiconductor chip is less than a height of the conductive protrusion.

6. The stackable semiconductor package according to claim 1, wherein the at least one conductive protrusion comprises at least one of gold, silver, copper, nickel, aluminum, tin, lead, platinum, bismuth, indium, an alloy thereof, or a combination thereof.

7. The stackable semiconductor package according to claim 1, wherein the conductive protrusion includes a plurality of conductive protrusions arranged in a row, and
the opening in the protective layer comprises a linear groove in the protective layer extending between and including regions corresponding to the plurality of conductive protrusions.

8. The stackable semiconductor package according to claim 1, wherein a height of the conductive protrusion above the semiconductor chip is the same as a height of the protective layer above the semiconductor chip.

9. The stackable semiconductor package according to claim 1, wherein a height of the conductive protrusion above the semiconductor chip is greater than a height of the protective layer above the semiconductor chip.

10. A stacked semiconductor package, comprising:
a first semiconductor package, comprising:
a first substrate having at least one land on a bottom surface and at least one bonding pad on an upper surface;
a first semiconductor chip mounted directly to the upper surface of the first substrate and including at least one terminal pad on an upper surface of the first semiconductor chip;
at least one first conductive protrusion on the at least one terminal pad; and
a first protective layer covering the first semiconductor chip and an upper surface of the first conductive protrusion and including an opening to expose an upper surface of the first conductive protrusion;
a second semiconductor package, comprising:
a second substrate having at least one land on a bottom surface and at least one bonding pads on an upper surface;
a second semiconductor chip mounted to the upper surface of the second substrate; and
a second protective layer to cover the second semiconductor chip; and
at least one solder connection to connect the at least one land on the bottom surface of the second substrate with the at least one first conductive protrusion.

11. The stacked semiconductor package according to claim 10, wherein at least one of the first semiconductor package and the second semiconductor package comprises:
a wire to directly connect the terminal pad of the first or second semiconductor chip with the bonding pad of the first or second substrate, respectively.

12. The stacked semiconductor package according to claim 11, wherein the wire includes a connecting end that is directly connected to the terminal pad on the first semiconductor chip and the first conductive protrusion is formed to enclose the connecting end and a portion of the wire.

13. The stacked semiconductor package according to claim 11, wherein the wire is directly connected to the first conductive protrusion and not to the terminal pad of the first semiconductor chip.

14. The stacked semiconductor package according to claim 11, wherein the wire connects the terminal pad of the first semiconductor chip with the bonding pad of the first substrate, and
a height of the wire above the upper surface of the first semiconductor chip is less than a height of the first conductive protrusion.

15. The stacked semiconductor package according to claim 10, wherein the second semiconductor package does not include a conductive protrusion on an upper surface of the second semiconductor chip.

16. The stacked semiconductor package according to claim 10, wherein the second semiconductor package does not include an opening in the second protective layer above the second semiconductor chip.

17. The stacked semiconductor package according to claim 10, wherein the at least one first conductive protrusion comprises at least one of gold, silver, copper, nickel, aluminum, tin, lead, platinum, bismuth, indium, an alloy thereof, or a combination thereof.

18. The stacked semiconductor package according to claim 10, wherein the at least one first conductive protrusion includes a plurality of conductive protrusions arranged in a row, and
the opening in the first protective layer comprises a linear groove in the first protective layer extending between and including regions corresponding to the plurality of conductive protrusions.

19. A stackable semiconductor package, comprising:
a substrate including a bonding pad on an upper surface of the substrate;
a semiconductor chip on the upper surface of the substrate, the semiconductor chip including at least one terminal pad on an upper surface thereof;
a conductive protrusion in directly contact with an upper surface of the terminal pad;
a wire configured to connect the terminal pad of the semiconductor chip with the bonding pad of the substrate; and
a protective layer on the semiconductor chip and the conductive protrusion, the protective layer including an opening to expose an upper surface of the conductive protrusion,
wherein the wire is in contact with the conductive protrusion.

20. The stackable semiconductor package according to claim 19, wherein the wire is in contact with an upper surface of the conductive protrusion.

* * * * *